United States Patent
Thomas et al.

(10) Patent No.: US 10,351,809 B2
(45) Date of Patent: Jul. 16, 2019

(54) POST CHEMICAL MECHANICAL POLISHING FORMULATIONS AND METHOD OF USE

(71) Applicant: ENTEGRIS, INC., Billerica, MA (US)

(72) Inventors: Elizabeth Thomas, Danbury, CT (US); Donald Frye, Sherman, CT (US); Jun Liu, Brookfield, CT (US); Michael White, Danbury, CT (US); Danela White, Danbury, CT (US); Chao-Yu Wang, Zhudong Town (TW)

(73) Assignee: Entegris, Inc., Billerica, MA (US)

(*) Notice: Subject to any disclaimer, the term of this patent is extended or adjusted under 35 U.S.C. 154(b) by 0 days.

(21) Appl. No.: 15/540,293

(22) PCT Filed: Jan. 5, 2016

(86) PCT No.: PCT/US2016/012152
§ 371 (c)(1),
(2) Date: Jun. 28, 2017

(87) PCT Pub. No.: WO2016/111990
PCT Pub. Date: Jul. 14, 2016

(65) Prior Publication Data
US 2018/0037852 A1 Feb. 8, 2018

Related U.S. Application Data

(60) Provisional application No. 62/099,844, filed on Jan. 5, 2015, provisional application No. 62/236,116, filed on Oct. 1, 2015.

(51) Int. Cl.
| | | |
|---|---|---|
| C11D 3/30 | (2006.01) | |
| C11D 11/00 | (2006.01) | |
| H01L 21/02 | (2006.01) | |
| B08B 3/08 | (2006.01) | |
| C11D 3/20 | (2006.01) | |
| C11D 3/26 | (2006.01) | |
| C11D 3/34 | (2006.01) | |
| C11D 7/32 | (2006.01) | |
| C11D 1/62 | (2006.01) | |
| H01L 21/321 | (2006.01) | |
| H01L 21/768 | (2006.01) | |

(52) U.S. Cl.
CPC ............ *C11D 11/0047* (2013.01); *B08B 3/08* (2013.01); *C11D 3/2096* (2013.01); *C11D 3/26* (2013.01); *C11D 3/30* (2013.01); *C11D 3/349* (2013.01); *H01L 21/02063* (2013.01); *H01L 21/02074* (2013.01); *C11D 3/3472* (2013.01); *H01L 21/3212* (2013.01); *H01L 21/7684* (2013.01)

(58) Field of Classification Search
CPC ........... C11D 11/047; C11D 3/30; C11D 7/32; C11D 1/62
USPC ................................................ 510/175, 176
See application file for complete search history.

(56) References Cited

U.S. PATENT DOCUMENTS

| | | | |
|---|---|---|---|
| 7,144,848 B2 | 12/2006 | Zhou et al. | |
| 2005/0205835 A1* | 9/2005 | Tamboli | C11D 3/2086 252/79.1 |
| 2006/0166847 A1 | 7/2006 | Walker et al. | |
| 2012/0283163 A1* | 11/2012 | Barnes | C11D 1/72 510/175 |
| 2013/0157919 A1 | 6/2013 | Mellies et al. | |
| 2014/0264151 A1 | 9/2014 | Ko | |
| 2015/0045277 A1 | 2/2015 | Liu | |
| 2015/0114429 A1* | 4/2015 | Jenq | H01L 21/02074 134/2 |
| 2016/0340620 A1* | 11/2016 | Sun | C23G 1/20 |

FOREIGN PATENT DOCUMENTS

| | | |
|---|---|---|
| JP | 2008-060377 A | 3/2008 |
| JP | 2011-159658 A | 8/2011 |
| JP | 2011-243610 A | 12/2011 |
| JP | 2013-157516 A | 8/2013 |
| JP | 2014-170927 A | 9/2014 |
| JP | 2014-212262 A | 11/2014 |
| JP | 2014212262 A | 11/2014 |
| KR | 20140139565 A | 12/2014 |
| TW | 201348438 A | 12/2013 |
| WO | 2013/142250 A1 | 9/2013 |
| WO | 2013/173743 A2 | 11/2013 |
| WO | 2014/151361 A1 | 9/2014 |
| WO | 2014/171355 A1 | 10/2014 |
| WO | 2014/186538 A1 | 11/2014 |
| WO | 2015/116818 A1 | 8/2015 |
| WO | 2016/111990 A1 | 7/2016 |

* cited by examiner

Primary Examiner — Gregory E Webb
(74) Attorney, Agent, or Firm — Entegris, Inc.

(57) ABSTRACT

A cleaning composition and process for cleaning post-chemical mechanical polishing (CMP) residue and contaminants from a microelectronic device having said residue and contaminants thereon. The cleaning compositions are substantially devoid of alkali hydroxides, alkaline earth metal hydroxides, and tetramethylammonium hydroxide. The composition achieves highly efficacious cleaning of the post-CMP residue and contaminant material from the surface of the microelectronic device without compromising the low-k dielectric material or the copper interconnect material.

20 Claims, No Drawings

POST CHEMICAL MECHANICAL POLISHING FORMULATIONS AND METHOD OF USE

FIELD

The present invention relates generally to compositions devoid of tetramethylammonium hydroxide for cleaning residue and/or contaminants from microelectronic devices having same thereon, wherein the compositions have improved cobalt compatibility.

DESCRIPTION OF THE RELATED ART

Microelectronic device wafers are used to form integrated circuits. The microelectronic device wafer includes a substrate, such as silicon, into which regions are patterned for deposition of different materials having insulative, conductive or semi-conductive properties.

In order to obtain the correct patterning, excess material used in forming the layers on the substrate must be removed. Further, to fabricate functional and reliable circuitry, it is important to prepare a flat or planar microelectronic wafer surface prior to subsequent processing. Thus, it is necessary to remove and/or polish certain surfaces of a microelectronic device wafer.

Chemical Mechanical Polishing or Planarization ("CMP") is a process in which material is removed from a surface of a microelectronic device wafer, and the surface is polished (more specifically, planarized) by coupling a physical process such as abrasion with a chemical process such as oxidation or chelation. In its most rudimentary form, CMP involves applying slurry, e.g., a solution of an abrasive and an active chemistry, to a polishing pad that buffs the surface of a microelectronic device wafer to achieve the removal, planarization, and polishing processes. It is not desirable for the removal or polishing process to be comprised of purely physical or purely chemical action, but rather the synergistic combination of both in order to achieve fast, uniform removal. In the fabrication of integrated circuits, the CMP slurry should also be able to preferentially remove films that comprise complex layers of metals and other materials so that highly planar surfaces can be produced for subsequent photolithography, or patterning, etching and thin-film processing.

Recently, copper has been increasingly used for metal interconnects in integrated circuits. In copper damascene processes commonly used for metallization of circuitry in microelectronic device fabrication, the layers that must be removed and planarized include copper layers having a thickness of about 1-1.5 μm and copper seed layers having a thickness of about 0.05-0.15 μm. These copper layers are separated from the dielectric material surface by a layer of barrier material, typically about 50-300 Å thick, which prevents diffusion of copper into the oxide dielectric material. One key to obtaining good uniformity across the wafer surface after polishing is to use a CMP slurry that has the correct removal selectivities for each material.

The foregoing processing operations, involving wafer substrate surface preparation, deposition, plating, etching and chemical mechanical polishing, variously require cleaning operations to ensure that the microelectronic device product is free of contaminants that would otherwise deleteriously affect the function of the product, or even render it useless for its intended function. Often, particles of these contaminants are smaller than 0.3 μm.

One particular issue in this respect is the residues that are left on the microelectronic device substrate following CMP processing. Such residues include CMP material and corrosion inhibitor compounds such as benzotriazole (BTA). If not removed, these residues can cause damage to copper lines or severely roughen the copper metallization, as well as cause poor adhesion of post-CMP applied layers on the device substrate. Severe roughening of copper metallization is particularly problematic, since overly rough copper can cause poor electrical performance of the product microelectronic device.

Another residue-producing process common to microelectronic device manufacturing involves gas-phase plasma etching to transfer the patterns of developed photoresist coatings to the underlying layers, which may consist of hardmask, interlevel dielectric (ILD), and etch stop layers. Post-gas phase plasma etch residues, which may include chemical elements present on the substrate and in the plasma gases, are typically deposited on the back end of the line (BEOL) structures and if not removed, may interfere with subsequent silicidation or contact formation. Conventional cleaning chemistries often damage the ILD, absorb into the pores of the ILD thereby increasing the dielectric constant, and/or corrode the metal structures.

There is a continuing need in the art to provide compositions and methods that effectively remove residue from a substrate, e.g., post-CMP residue, post-etch residue, and post-ash residue. The compositions are more environmentally friendly than the prior art compositions and can include innovative components and as such, can be considered an alternative to the compositions of the prior art.

SUMMARY

The present invention generally relates to a composition and process for cleaning residue and/or contaminants from microelectronic devices having said residue and contaminants thereon. The cleaning compositions of the invention are substantially devoid of alkali hydroxides, alkaline earth metal hydroxides, and tetramethylammonium hydroxide. The residue may include post-CMP, post-etch, and/or post-ash residue. Advantageously, the compositions described herein show improved cobalt compatibility relative to compositions in the prior art.

In one aspect, a composition is described, said composition comprising at least one organic amine, at least one solvent, at least one quaternary base, at least one complexing agent, optionally at least one reducing agent, optionally at least one additional etchant, and optionally at least one cleaning additive, wherein the cleaning composition is substantially devoid of alkali hydroxides, alkaline earth metal hydroxides, and tetramethylammonium hydroxide.

In another aspect, composition is described, said composition comprising at least one organic amine, at least one solvent, at least one quaternary base, at least one complexing agent, at least one reducing agent, optionally at least one additional etchant, and optionally at least one cleaning additive, wherein the cleaning composition is substantially devoid of alkali hydroxides, alkaline earth metal hydroxides, and tetramethylammonium hydroxide.

In still another aspect, a composition is described, said composition comprising at least one organic amine, at least one solvent, at least one quaternary base, at least one complexing agent, at least one additional etchant, optionally at least one reducing agent, and optionally at least one cleaning additive, wherein the cleaning composition is substantially devoid of alkali hydroxides, alkaline earth metal hydroxides, and tetramethylammonium hydroxide.

In yet another aspect, a method of removing residue and contaminants from a microelectronic device having said residue and contaminants thereon is described, said method comprising contacting the microelectronic device with a cleaning composition for sufficient time to at least partially clean said residue and contaminants from the microelectronic device, wherein the cleaning composition comprises at least one organic amine, at least one solvent, at least one quaternary base, at least one complexing agent, optionally at least one reducing agent, optionally at least one additional etchant, and optionally at least one cleaning additive, wherein the cleaning composition is substantially devoid of alkali hydroxides, alkaline earth metal hydroxides, and tetramethylammonium hydroxide.

Other aspects, features and advantages will be more fully apparent from the ensuing disclosure and appended claims.

DETAILED DESCRIPTION, AND PREFERRED EMBODIMENTS THEREOF

The present invention relates generally to compositions useful for the removal of residue and contaminants from a microelectronic device having such material(s) thereon. The compositions are particularly useful for the removal of post-CMP, post-etch or post-ash residue.

For ease of reference, "microelectronic device" corresponds to semiconductor substrates, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly.

As used herein, "residue" corresponds to particles generated during the manufacture of a microelectronic device including, but not limited to, plasma etching, ashing, chemical mechanical polishing, wet etching, and combinations thereof.

As used herein, "contaminants" correspond to chemicals present in the CMP slurry, reaction by-products of the polishing slurry, chemicals present in the wet etching composition, reaction by products of the wet etching composition, and any other materials that are the by-products of the CMP process, the wet etching, the plasma etching or the plasma ashing process.

As used herein, "post-CMP residue" corresponds to particles from the polishing slurry, e.g., silica-containing particles, chemicals present in the slurry, reaction by-products of the polishing slurry, carbon-rich particles, polishing pad particles, brush deloading particles, equipment materials of construction particles, metals, metal oxides, organic residues, and any other materials that are the by-products of the CMP process. As defined herein, the "metals" that are typically polished include copper, aluminum and tungsten.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, "complexing agent" includes those compounds that are understood by one skilled in the art to be complexing agents, chelating agents and/or sequestering agents. Complexing agents will chemically combine with or physically hold the metal atom and/or metal ion to be removed using the compositions described herein.

As defined herein, the term "barrier material" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, tungsten, cobalt, and other refractory metals and their nitrides and silicides.

As defined herein, "post-etch residue" corresponds to material remaining following gas-phase plasma etching processes, e.g., BEOL dual damascene processing, or wet etching processes. The post-etch residue may be organic, organometallic, organosilicic, or inorganic in nature, for example, silicon-containing material, carbon-based organic material, and etch gas residue such as oxygen and fluorine.

As defined herein, "post-ash residue," as used herein, corresponds to material remaining following oxidative or reductive plasma ashing to remove hardened photoresist and/or bottom anti-reflective coating (BARC) materials. The post-ash residue may be organic, organometallic, organosilicic, or inorganic in nature.

"Substantially devoid" is defined herein as less than 2 wt. %, preferably less than 1 wt. %, more preferably less than 0.5 wt. %, and most preferably less than 0.1 wt. %. In one embodiment, "substantially devoid" corresponds to zero percent.

As defined herein, cobalt-containing materials include any material comprising greater than 50 wt % elemental cobalt, based on the total weight of the material. Examples of cobalt-containing materials include, but are not limited to, pure cobalt, cobalt nitrides (including cobalt nitrides comprising additional elements such as Ta or Li), CoP, CoSi, and cobalt silicide.

As used herein, "about" is intended to correspond to ±5% of the stated value.

As defined herein, "reaction or degradation products" include, but are not limited to, product(s) or byproduct(s) formed as a result of catalysis at a surface, oxidation, reduction, reactions with the compositional components, or that otherwise polymerize; product(s) or byproduct(s) formed formed as a result of a change(s) or transformation(s) in which a substance or material (e.g., molecules, compounds, etc.) combines with other substances or materials, interchanges constituents with other substances or materials, decomposes, rearranges, or is otherwise chemically and/or physically altered, including intermediate product(s) or byproduct(s) of any of the foregoing or any combination of the foregoing reaction(s), change(s) and/or transformation(s). It should be appreciated that the reaction or degradation products may have a larger or smaller molar mass than the original reactant.

As used herein, "suitability" for cleaning residue and contaminants from a microelectronic device having said residue and contaminants thereon corresponds to at least partial removal of said residue/contaminants from the microelectronic device. Cleaning efficacy is rated by the reduction of objects on the microelectronic device. For example, pre- and post-cleaning analysis may be carried out using an atomic force microscope. The particles on the sample may be registered as a range of pixels. A histogram (e.g., a Sigma Scan Pro) may be applied to filter the pixels in a certain intensity, e.g., 231-235, and the number of particles counted. The particle reduction may be calculated using:

Cleaning Efficacy =
$$\frac{(\text{Number of PreClean Objects} - \text{Number of PostClean Objects})}{\text{Number of PreClean Objects}} \times 100$$

Notably, the method of determination of cleaning efficacy is provided for example only and is not intended to be limited to same. Alternatively, the cleaning efficacy may be considered as a percentage of the total surface that is covered by particulate matter. For example, AFM's may be programmed to perform a z-plane scan to identify topographic areas of interest above a certain height threshold and then calculate the area of the total surface covered by said areas of interest. One skilled in the art would readily understand that the less area covered by said areas of interest post-cleaning, the more efficacious the cleaning composition. Preferably, at least 75% of the residue/contaminants are removed from the microelectronic device using the compositions described herein, more preferably at least 90%, even more preferably at least 95%, and most preferably at least 99% of the residue/contaminants are removed.

Compositions described herein may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

In a first aspect, the cleaning compositions comprise, consist of, or consist essentially of at least one organic amine, at least one solvent (e.g., water), at least one quaternary base, optionally at least one complexing agent, optionally at least one reducing agent, optionally at least one additional etchant, and optionally at least one cleaning additive, wherein the cleaning composition is substantially devoid of alkali hydroxides, alkaline earth metal hydroxides, and tetramethylammonium hydroxide. In one embodiment, the cleaning compositions comprise, consist of, or consist essentially of at least one organic amine, at least one solvent (e.g., water), at least one complexing agent, and at least one quaternary base, wherein the cleaning composition is substantially devoid of alkali hydroxides, alkaline earth metal hydroxides, and tetramethylammonium hydroxide. In another embodiment, the cleaning compositions comprise, consist of, or consist essentially of at least one organic amine, at least one solvent (e.g., water), at least one quaternary base, and at least one reducing agent, wherein the cleaning composition is substantially devoid of alkali hydroxides, alkaline earth metal hydroxides, and tetramethylammonium hydroxide. In another embodiment, the cleaning compositions comprise, consist of, or consist essentially of at least one organic amine, at least one solvent (e.g., water), at least one reducing agent, at least one complexing agent, and at least one quaternary base, wherein the cleaning composition is substantially devoid of alkali hydroxides, alkaline earth metal hydroxides, and tetramethylammonium hydroxide. In still another embodiment, the cleaning compositions comprise, consist of, or consist essentially of at least one organic amine, at least one solvent (e.g., water), at least one complexing agent, at least one quaternary base, and at least one additional etchant, wherein the cleaning composition is substantially devoid of alkali hydroxides, alkaline earth metal hydroxides, and tetramethylammonium hydroxide. In yet another embodiment, the cleaning compositions comprise, consist of, or consist essentially of at least one organic amine, at least one solvent (e.g., water), at least one complexing agent, at least one quaternary base, and at least one cleaning additive, wherein the cleaning composition is substantially devoid of alkali hydroxides, alkaline earth metal hydroxides, and tetramethylammonium hydroxide. In another embodiment, the cleaning compositions comprise, consist of, or consist essentially of at least one organic amine, at least one solvent (e.g., water), at least one reducing agent, at least one complexing agent, at least one quaternary base, and at least one additional etchant, wherein the cleaning composition is substantially devoid of alkali hydroxides, alkaline earth metal hydroxides, and tetramethylammonium hydroxide. In still another embodiment, the cleaning compositions comprise, consist of, or consist essentially of at least one organic amine, at least one solvent (e.g., water), at least one reducing agent, at least one complexing agent, at least one quaternary base, and at least one additional cleaning additive, wherein the cleaning composition is substantially devoid of alkali hydroxides, alkaline earth metal hydroxides, and tetramethylammonium hydroxide. In yet another embodiment, the cleaning compositions comprise, consist of, or consist essentially of at least one organic amine, at least one solvent (e.g., water), at least one reducing agent, at least one complexing agent, at least one quaternary base, at least one additional etchant, and at least one additional cleaning additive, wherein the cleaning composition is substantially devoid of alkali hydroxides, alkaline earth metal hydroxides, and tetramethylammonium hydroxide. Advantageously, the compositions described herein show improved cobalt compatibility relative to compositions in the prior art.

In one preferred embodiment, the cleaning composition of the first aspect comprises, consists of or consists essentially of at least one quaternary base, at least one organic amine, at least one complexing agent, at least one solvent (e.g., water), and at least one reducing agent, wherein at least one complexing agents comprises cysteine, wherein the cleaning composition is substantially devoid of alkali hydroxides, alkaline earth metal hydroxides, and tetramethylammonium hydroxide, wherein the cleaning composition is formulated in the following concentrated embodiments, wherein all percentages are by weight, based on the total weight of the formulation:

| component of | % by weight | preferably (% by weight) | more preferably (% by weight) |
| --- | --- | --- | --- |
| organic amine(s) | about 0.01% to about 10% | about 0.01% to about 8% | about 0.01% to about 5% |
| complexing agent(s) | about 0.00005% to about 1% | about 0.00005% to about 0.5% | about 0.00005% to about 0.2% |
| reducing | about 0.01% to | about 0.01% to | about 0.01% to |

| component of | % by weight | preferably (% by weight) | more preferably (% by weight) |
|---|---|---|---|
| agent(s) | about 8% | about 5% | about 4% |
| water | about 61% to about 99.97% | about 71.5% to about 99.97% | about 80.9% to about 99.97% |
| quaternary base(s) | about 0.01% to about 20% | about 0.01% to about 15% | about 0.01% to about 10% |

When present, the amount of cysteine is preferably in a range from about 0.00005 wt % to about 0.2 wt %. Although not wishing to be bound by theory, when the amount of cysteine is greater than about 0.2 wt %, a very thick passivating layer is formed on copper and cobalt which cannot be rinsed off very easily and thus contributes to organic residues. The weight percent ratios are as follows: organic amine(s)/complexing agent(s) in a range from about 1 to about 200, preferably about 10 to about 150, more preferably about 50 to about 120; quaternary base(s)/complexing agent(s) in a range from about 1 to about 300, preferably about 10 to about 250, more preferably about 50 to about 200, or preferably about 1 to about 10; and reducing agent(s)/complexing agent(s) in a range from about 1 to about 200, preferably about 10 to about 150, more preferably about 50 to about 120.

In another preferred embodiment, the cleaning composition of the first aspect comprises, consists of or consists essentially of at least one organic amine, at least one complexing agent, at least one solvent (e.g., water), and at least one quaternary base, wherein at least one complexing agents comprises cysteine, wherein the cleaning composition is substantially devoid of alkali hydroxides, alkaline earth metal hydroxides, and tetramethylammonium hydroxide, wherein the cleaning composition is formulated in the following concentrated embodiments, wherein all percentages are by weight, based on the total weight of the formulation:

| component of | % by weight | preferably (% by weight) | more preferably (% by weight) |
|---|---|---|---|
| organic amine(s) | about 0.01% to about 10% | about 0.01% to about 8% | about 0.01% to about 5% |
| complexing agent(s) | about 0.00005% to about 1% | about 0.00005% to about 0.5% | about 0.00005% to about 0.2% |
| quaternary base(s) | about 0.01% to about 20% | about 0.01% to about 15% | about 0.01% to about 10% |
| water | about 81% to about 99.98% | about 86.5% to about 99.98% | about 90.9% to about 99.98% |

When present, the amount of cysteine is preferably in a range from about 0.00005 wt % to about 0.2 wt %. The weight percent ratios are as follows: organic amine(s)/complexing agent(s) in a range from about 1 to about 200, preferably about 10 to about 150, more preferably about 50 to about 120; and quaternary base(s)/complexing agent(s) in a range from about 1 to about 300, preferably about 10 to about 250, more preferably about 50 to about 200, or preferably about 1 to about 10.

In yet another embodiment, the cleaning composition comprises, consists of, or consists essentially of at least one organic amine, cysteine, at least one additional complexing agent, at least one quaternary base, water, optionally at least one additional etchant, and optionally at least one cleaning additive, wherein the cleaning composition is formulated in the following concentrated embodiments, wherein all percentages are by weight, based on the total weight of the formulation:

| component of | % by weight | preferably (% by weight) | more preferably (% by weight) |
|---|---|---|---|
| organic amine(s) | about 0.01% to about 10% | about 0.01% to about 8% | about 0.01% to about 5% |
| cysteine | about 0.00005% to about 1% | about 0.00005% to about 0.5% | about 0.00005% to about 0.2% |
| complexing agent(s) | about 0.0005% to about 1% | about 0.0005% to about 0.5% | about 0.0005% to about 0.2% |
| quaternary base(s) | about 0.01% to about 20% | about 0.01% to about 15% | about 0.01% to about 10% |
| water | about 80% to about 99.98% | about 86% to about 99.98% | about 90.7% to about 99.98% |

The weight percent ratios are as follows: organic amine(s)/cysteine in a range from about 1 to about 200, preferably about 10 to about 150, more preferably about 50 to about 120; quaternary base(s)/cysteine in a range from about 0.1 to about 100, preferably about 1 to about 60, more preferably about 2 to about 25; and complexing agent(s)/cysteine in a range from about 0.01 to about 50, preferably about 0.1 to about 30, more preferably about 1 to about 10.

In still another preferred embodiment, the cleaning composition of the first aspect comprises, consists of or consists essentially of at least one organic amine, at least one complexing agent, at least one solvent (e.g., water), at least one quaternary base, and at least one additional etchant, wherein at least one complexing agents comprises cysteine, wherein the cleaning composition is substantially devoid of alkali hydroxides, alkaline earth metal hydroxides, and tetramethylammonium hydroxide, and wherein the amount of cysteine is in a range from about 0.00005 wt % to about 0.2 wt %, based on the total weight of the composition. The weight percent ratios are as follows: organic amine(s)/complexing agent(s) in a range from about 1 to about 200, preferably about 1 to about 40, more preferably about 1 to about 20; quaternary base(s)/complexing agent(s) in a range from about 1 to about 300, preferably about 10 to about 100, more preferably about 20 to about 80 or about 1 to about 10; and additional etchant(s)/complexing agent(s) in a range from about 1 to about 100, preferably about 10 to about 80, more preferably about 10 to about 50.

Illustrative organic amines that may be useful in specific compositions include species having the general formula $NR^1R^2R^3$, wherein $R^1$, $R^2$ and $R^3$ may be the same as or different from one another and are selected from the group consisting of hydrogen, straight-chained or branched $C_1$-$C_6$ alkyl (e.g., methyl, ethyl, propyl, butyl, pentyl, and hexyl), straight-chained or branched $C_1$-$C_6$ alcohol (e.g., methanol, ethanol, propanol, butanol, pentanol, and hexanol), and straight chained or branched ethers having the formula $R^4$—O—$R^5$, where $R^4$ and $R^5$ may be the same as or different from one another and are selected from the group consisting of $C_1$-$C_6$ alkyls as defined above. Most preferably, at least one of $R^1$, $R^2$ and $R^3$ is a straight-chained or branched $C_1$-$C_6$ alcohol. Examples include, without limitation, alkanolamines such as alkanolamines such as aminoethylethanolamine, N-methylaminoethanol, aminoethoxyethanol, dimethylaminoethoxyethanol, diethanolamine, N-methyldiethanolamine, monoethanolamine, triethanolamine, 1-amino-2-propanol, 3-amino-1-propanol, diisopropylamine, isopropylamine, 2-amino-1-butanol, isobutanolamine, other $C_1$-$C_8$ alkanolamines, and combinations thereof; amines such as triethylenediamine, ethylenediamine, hexamethylenediamine, diethylenetriamine, triethylamine, trimethylamine, and combinations thereof; diglycolamine; morpholine; and combinations of amines and alkanolamines. When the amine includes the ether component, the amine may be considered an alkoxyamine, e.g., 1-methoxy-2-aminoethane. Preferably, the organic amine comprises monoethanolamine.

Reducing agents, when present, include, but are not limited to, ascorbic acid, L(+)-ascorbic acid, isoascorbic acid, ascorbic acid derivatives, gallic acid, formamidinesulfinic acid, uric acid, tartaric acid, cysteine, and any combination thereof. Preferably, the reducing agent comprises ascorbic acid, tartaric acid, or a combination thereof.

Quaternary bases include compounds having the formula $NR^1R^2R^3R^4OH$, wherein $R^1$, $R^2$, $R^3$ and $R^4$ may be the same as or different from one another and are selected from the group consisting of hydrogen, straight-chained or branched $C_2$-$C_6$ alkyl (e.g., methyl, ethyl, propyl, butyl, pentyl, and hexyl), and substituted or unsubstituted $C_6$-$C_{10}$ aryl, e.g., benzyl. Tetraalkylammonium hydroxides that are commercially available include tetraethylammonium hydroxide (TEAH), tetrapropylammonium hydroxide (TPAH), tetrabutylammonium hydroxide (TBAH), tributylmethylammonium hydroxide (TBMAH), benzyltrimethylammonium hydroxide (BTMAH), choline hydroxide, ethyltrimethylammonium hydroxide, tris(2-hydroxyethyl)methyl ammonium hydroxide, diethyldimethylammonium hydroxide, and combinations thereof, may be used. Tetraalkylammonium hydroxides which are not commercially available may be prepared in a manner analogous to the published synthetic methods used to prepare TEAH, TPAH, TBAH, TBMAH, and BTMAH, which are known to one ordinary of skill in the art. Alternatively or in addition, the at least one quaternary base can be a compound of the formula $(PR^1R^2R^3R^4)$ OH, wherein $R^1$, $R^2$, $R^3$, and $R^4$ may be the same as or different from one another and are selected from the group consisting of hydrogen, straight-chained $C_1$-$C_6$ alkyl (e.g., methyl, ethyl, propyl, butyl, pentyl, hexyl), branched $C_1$-$C_6$ alkyl, $C_1$-$C_6$ alkanol (e.g., methanol, ethanol, propanol, butanol, pentanol, hexanol), substituted $C_6$-$C_{10}$ aryl, unsubstituted $C_6$-$C_{10}$ aryl (e.g., benzyl), and any combination thereof, such as tetrabutylphosphonium hydroxide (TBPH), tetramethylphosphonium hydroxide, tetraethylphosphonium hydroxide, tetrapropylphosphonium hydroxide, benzyltriphenylphosphonium hydroxide, methyl triphenylphosphonium hydroxide, ethyl triphenylphosphonium hydroxide, N-propyl triphenylphosphonium hydroxide. Preferably, the quaternary base comprises choline hydroxide.

The complexing agents contemplated herein include, but are not limited to, acetic acid, acetone oxime, acrylic acid, adipic acid, alanine, arginine, asparagine, aspartic acid, betaine, dimethyl glyoxime, formic acid, fumaric acid, gluconic acid, glutamic acid, glutamine, glutaric acid, glyceric acid, glycerol, glycolic acid, glyoxylic acid, histidine, iminodiacetic acid, isophthalic acid, itaconic acid, lactic acid, leucine, lysine, maleic acid, maleic anhydride, malic acid, malonic acid, mandelic acid, 2,4-pentanedione, phenylacetic acid, phenylalanine, phthalic acid, proline, propionic acid, pyrocatecol, pyromellitic acid, quinic acid, serine, sorbitol, succinic acid, tartaric acid, terephthalic acid, trimellitic acid, trimesic acid, tyrosine, valine, xylitol, ethylenediamine, oxalic acid, tannic acid, benzoic acid, ammonium benzoate, catechol, pyrogallol, resorcinol, hydroquinone, cyanuric acid, barbituric acid and derivatives such as 1,2-dimethylbarbituric acid, alpha-keto acids such as pyruvic acid, propanethiol, benzohydroxamic acids, tetraethylenepentamine (TEPA), 4-(2-hydroxyethyl)morpholine (HEM), N-aminoethylpiperazine (N-AEP), ethylenediaminetetraacetic acid (EDTA), 1,2-cyclohexanediamine-N,N,N',N'-tetraacetic acid (CDTA), glycine/ascorbic acid, iminodiacetic acid (IDA), 2-(hydroxyethyl)iminodiacetic acid (HIDA), nitrilotriacetic acid, thiourea, 1,1,3,3-tetramethylurea, urea, urea derivatives, glycine, alanine, arginine, asparagine, aspartic acid, cysteine, glutamic acid, glutaric acid, glutamine, histidine, isoleucine, leucine, lysine, methionine, phenylalanine, piperadine, N-(2-aminoethyl) piperadine, proline, pyrrolidine, serine, threonine, tryptophan, tyrosine, valine, phosphonic acid and derivatives thereof such as 1-hydroxyethylidene-1,1-diphosphonic acid (HEDP), 1,5,9-triazacyclododecane-N,N,N''-tris(methylenephosphonic acid) (DO-TRP), 1,4,7,10-tetraazacyclododecane-N,N,N'',N'''-tetrakis (methylenephosphonic acid) (DOTP), nitrilotris(methylene) triphosphonic acid, diethylenetriaminepenta (methylenephosphonic acid) (DETAP), aminotri (methylenephosphonic acid), is(hexamethylene)triamine phosphonic acid, 1,4,7-triazacyclononane-N,N,N''-tris (methylenephosphonic acid (NOTP), salts and derivatives thereof, and combinations thereof. In a preferred embodiment, preferably the complexing agent comprises cysteine, oxalic acid, dimethyl glyoxime, tartaric acid, or any combination thereof. In one preferred embodiment, the complexing agent comprises cysteine and oxalic acid.

When present, the at least one additional etchant includes, but is not limited to, morpholine, diglycolamine, 3-butoxypropylamine, propylene glycol monobutyl ether (e.g., DOWANOL PnB (The Dow Chemical Company), hydroxyethylmorpholine, hydroxypropylmorpholine, aminoethylmorpholine, aminopropylmorpholine, pentamethyldiethylenetriamine (PMDETA), trimethylaminoethylethanolamine, trimethylaminopropylethanolamine, and combinations thereof. When present, the at least one additional etchant comprises morpholine, diglycolamine, or a combination thereof.

When present, the at least one cleaning additive includes, but is not limited to, hydroxypropylcellulose, hydroxyethylcellulose, carboxymethylcellulose, sodium carboxymethylcellulose (Na CMC), polyvinylpyrrolidone (PVP), any polymer made using the N-vinyl pyrrolidone monomer, polyacrylic acid esters and analogoues of polyacrylic acid esters, polyaminoacids (e.g., polyalanine, polyleucine, polyglycine, etc.), polyamidohydroxyurethanes, polylactones, polyacrylamide, Xanthan gum, chitosan, polyethylene oxide, polyvinyl alcohol, polyvinyl acetate, polyacrylic acid, polyethyleneimine, sugar alcohols such as sorbitol and xylitol, esters of anhydrosorbitols, secondary alcohol ethoxylates such as TERGITOL, and combinations thereof. When present, the at least one cleaning additive is present in the cleaning composition of the first aspect in an amount from about 0.0001 wt % to about 1 wt %, preferably about 0.0001 wt % to about 0.2 wt %, based on the total weight of the composition.

In a particularly preferred embodiment, the cleaning composition of the first aspect comprises, consists of, or consists essentially of choline hydroxide, at least one amine, at least one complexing agent, at least one reducing agent, and water, wherein the cleaning composition is substantially devoid of alkali hydroxides, alkaline earth metal hydroxides, and tetramethylammonium hydroxide. For example, the cleaning composition of the first aspect can comprise, consist of or consist essentially of choline hydroxide, at least one alkanolamine, cysteine, at least one reducing agent, and water, preferably choline hydroxide, monoethanolamine (MEA), cysteine, ascorbic acid, and water, wherein the cleaning composition is substantially devoid of alkali hydroxides, alkaline earth metal hydroxides, and tetramethylammonium hydroxide and wherein the amount of cysteine is in a range from about 0.00005 wt % to about 0.2 wt %. The weight percent ratios are as follows: organic amine(s)/complexing agent(s) in a range from about 1 to about 200, preferably about 10 to about 150, more preferably about 50 to about 120; choline hydroxide/complexing agent(s) in a range from about 1 to about 300, preferably about 10 to about 250, more preferably about 50 to about 200, or preferably about 1 to about 10; and reducing agent(s)/complexing agent(s) in a range from about 1 to about 200, preferably about 10 to about 150, more preferably about 50 to about 120.

In another particularly preferred embodiment, the cleaning composition of the first aspect comprises, consists of, or consists essentially of at least one amine, cysteine, choline hydroxide, and water, wherein the cleaning composition is substantially devoid of alkali hydroxides, alkaline earth metal hydroxides, and tetramethylammonium hydroxide. For example, the cleaning composition can comprise, consist of or consist essentially of at least one alkanolamine, cysteine, choline hydroxide, and water, preferably monoethanolamine, cysteine, choline hydroxide, optionally tartaric acid, and water, wherein the cleaning composition is substantially devoid of alkali hydroxides, alkaline earth metal hydroxides, and tetramethylammonium hydroxide and wherein the amount of cysteine is in a range from about 0.00005 wt % to about 0.2 wt %. In another embodiment, the cleaning composition of the first aspect can comprise, consist of or consist essentially of at least one alkanolamine, cysteine, at least one additional complexing agent, choline hydroxide, and water, preferably monoethanolamine, cysteine, choline hydroxide, oxalic acid, and water, wherein the cleaning composition is substantially devoid of alkali hydroxides, alkaline earth metal hydroxides, and tetramethylammonium hydroxide and wherein the amount of cysteine is in a range from about 0.00005 wt % to about 0.2 wt %. The weight percent ratios are as follows: organic amine(s)/complexing agent(s) in a range from about 1 to about 200, preferably about 10 to about 150, more preferably about 50 to about 120; and quaternary base(s)/complexing agent(s) in a range from about 1 to about 300, preferably about 10 to about 250, more preferably about 50 to about 200, or preferably about 1 to about 10.

In still another particularly preferred embodiment, the cleaning composition of the first aspect comprises, consists of, or consists essentially of at least one amine, at least one complexing agent, choline hydroxide, at least one additional etchant, and water, wherein the cleaning composition is substantially devoid of alkali hydroxides, alkaline earth metal hydroxides, and tetramethylammonium hydroxide. For example, the cleaning composition can comprise, consist of or consist essentially of at least one alkanolamine, cysteine, choline hydroxide, at least one additional etchant, water, and optionally at least one additional complexing agent, preferably (i) monoethanolamine, cysteine, choline hydroxide, morpholine or diglycolamine, and water, or (ii) preferably monoethanolamine, cysteine, oxalic acid, choline hydroxide, morpholine or diglycolamine, and water, wherein the cleaning composition is substantially devoid of alkali hydroxides, alkaline earth metal hydroxides, and tetramethylammonium hydroxide and wherein the amount of cysteine is in a range from about 0.00005 wt % to about 0.2 wt %. The weight percent ratios are as follows: organic amine(s)/cysteine in a range from about 1 to about 100, preferably about 1 to about 40, more preferably about 1 to about 20; quaternary base(s)/complexing agent(s) in a range from about 1 to about 300, preferably about 10 to about 100, more preferably about 20 to about 80 or about 1 to about 10; and additional etchant(s)/complexing agent(s) in a range from about 1 to about 100, preferably about 10 to about 80, more preferably about 10 to about 50.

The cleaning compositions of the first aspect can further comprise at least one metal corrosion inhibitor. When present, the at least one metal corrosion inhibitor is added to the cleaning composition of the first aspect to lower the corrosion rate of metals, e.g., copper, aluminum, as well as enhance the cleaning performance. Corrosion inhibitors contemplated include, but are not limited to: adenosine, adenine, pyrazole, 1,2,4-triazole, 1,2,3-triazole, imidazole, 1H-pyrazole-4-carboxylic acid, 3-amino-5-tert-butyl-1H-pyrazole, 5-amino-1H-tetrazole, 4-methylpyrazole, 2-mercaptobenzimidazole, 2-amino-5-(ethylthio)-1,3,4-thiadiazole, 2-amino-5-ethyl-1,3,4-thiadiazole, derivatives thereof, and combinations thereof. The amount of the at least one corrosion inhibitor is preferably in a range from about 0.001 wt % to about 1 wt %.

The cleaning compositions of the first aspect are particularly useful for cleaning residue and contaminants, e.g., post-CMP residue, post-etch residue, post-ash residue, and contaminants from a microelectronic device structure while still being compatible with cobalt-containing materials present on the surface. Regardless of the embodiment, the cleaning compositions are preferably substantially devoid, or devoid, of at least one of oxidizing agents (e.g., hydrogen peroxide); fluoride-containing sources; abrasive materials; alkali and/or alkaline earth metal bases; tetramethylammonium hydroxide; derivatives of cysteine; surfactants; sulfonium compounds; amidoxime compounds; and combinations thereof, prior to removal of residue material from the microelectronic device. In addition, the cleaning compositions should not solidify to form a polymeric solid, for example, photoresist.

The pH of the cleaning composition of the first aspect is greater than 7, preferably in a range from about 10 to greater than 14, most preferably in a range from about 12 to about 14.

The range of weight percent ratios of the components will cover all possible concentrated or diluted embodiments of the compositions of the first aspect. Towards that end, in one embodiment, a concentrated cleaning composition is provided that can be diluted for use as a cleaning solution. A concentrated cleaning composition, or "concentrate," advantageously permits a user, e.g. CMP process engineer, to dilute the concentrate to the desired strength and pH at the point of use. Dilution of the concentrated cleaning composition may be in a range from about 1:1 to about 2500:1, preferably about 5:1 to about 200:1, and most preferably about 25:1 to about 100:1, wherein the cleaning composition is diluted at or just before the tool with solvent, e.g., deionized water. It is to be appreciated by one skilled in the art that following dilution, the range of weight percent ratios of the components disclosed herein should remain unchanged.

The compositions of the first aspect may have utility in applications including, but not limited to, post-etch residue removal, post-ash residue removal surface preparation, post-plating cleaning and post-CMP residue removal. In addition, it is contemplated that the cleaning compositions may be useful for the cleaning and protection of other metal (e.g., copper-containing) products including, but not limited to, decorative metals, metal wire bonding, printed circuit boards and other electronic packaging using metal or metal alloys.

In yet another preferred embodiment, the cleaning compositions of the first aspect further include residue and/or contaminants. The residue and contaminants may be dissolved in the compositions. Alternatively, the residue and contaminants may be suspended in the compositions. Preferably, the residue includes post-CMP residue, post-etch residue, post-ash residue, contaminants, or combinations thereof.

The cleaning compositions described herein are easily formulated by simple addition of the respective ingredients and mixing to homogeneous condition. Furthermore, the compositions may be readily formulated as single-package formulations or multi-part formulations that are mixed at or before the point of use, e.g., the individual parts of the multi-part formulation may be mixed at the tool or in a storage tank upstream of the tool. The concentrations of the respective ingredients may be widely varied in specific multiples of the composition, i.e., more dilute or more concentrated, and it will be appreciated that the compositions described herein can variously and alternatively comprise, consist or consist essentially of any combination of ingredients consistent with the disclosure herein.

Accordingly, another aspect relates to a kit including, in one or more containers, one or more components adapted to form the cleaning compositions described herein. The kit may include, in one or more containers, at least one quaternary base, at least one amine, at least one complexing agent, at least one reducing agent, water, optionally at least one additional etchant, and optionally at least one cleaning additive, for combining with solvent, e.g., water, at the fab or the point of use. In another embodiment, the kit may include, in one or more containers, at least one quaternary base, at least one amine, at least one complexing agent, water, optionally at least one additional etchant, and optionally at least one cleaning additive, for combining with solvent, e.g., water, at the fab or the point of use. Alternatively, the kit may include, in a first container at least one amine, cysteine, at least one quaternary base, and water, for combining with each other and solvent, e.g., water, at the fab or the point of use. In another alternative, the kit may include, in one or more containers, at least one quaternary base, at least one amine, cysteine, at least one additional complexing agent, water, optionally at least one additional etchant, and optionally at least one cleaning additive, for combining with solvent, e.g., water, at the fab or the point of use. The containers of the kit must be suitable for storing and shipping said cleaning compositions, for example, NOW-Pak® containers (Entegris, Inc., Billerica, Mass., USA). The kit containers preferably are substantially devoid of alkali hydroxides, alkaline earth metal hydroxides, and tetramethylammonium hydroxide.

As applied to microelectronic manufacturing operations, the cleaning compositions described herein are usefully employed to clean post-CMP residue and/or contaminants from the surface of the microelectronic device. The cleaning compositions do not substantially damage low-k dielectric materials, cobalt-containing materials, or corrode metal interconnects on the device surface. Preferably the cleaning compositions remove at least 85% of the residue present on the device prior to residue removal, more preferably at least 90%, even more preferably at least 95%, and most preferably at least 99%.

In post-CMP residue and contaminant cleaning application, the cleaning compositions described herein may be used with a large variety of conventional cleaning tools such as megasonics and brush scrubbing, including, but not limited to, Verteq single wafer megasonic Goldfinger, OnTrak systems DDS (double-sided scrubbers), SEZ or other single wafer spray rinse, Applied Materials Mirra-Mesa™/Reflexion™/Reflexion LK™, and Megasonic batch wet bench systems.

In use of the compositions for cleaning post-CMP residue, post-etch residue, post-ash residue and/or contaminants from microelectronic devices having same thereon, the cleaning composition typically is contacted with the device for a time of from about 5 sec to about 10 minutes, preferably about 1 sec to 20 min, preferably about 15 sec to about 5 min at temperature in a range of from about 20° C. to about 90° C., preferably about 20° C. to about 50° C. Such contacting times and temperatures are illustrative, and any other suitable time and temperature conditions may be employed that are efficacious to at least partially clean the post-CMP residue/contaminants from the device, within the broad practice of the method. "At least partially clean" and "substantial removal" both correspond to at removal of at least 85% of the residue present on the device prior to residue removal, more preferably at least 90%, even more preferably at least 95%, and most preferred at least 99%.

Following the achievement of the desired cleaning action, the cleaning compositions may be readily removed from the device to which it has previously been applied, as may be desired and efficacious in a given end use application of the compositions described herein. Preferably, the rinse solution includes deionized water. Thereafter, the device may be dried using nitrogen or a spin-dry cycle.

Yet another aspect relates to the improved microelectronic devices made according to the methods described herein and to products containing such microelectronic devices.

Another aspect relates to a recycled cleaning composition, wherein the cleaning composition may be recycled until residue and/or contaminant loading reaches the maximum amount the cleaning composition may accommodate, as readily determined by one skilled in the art.

A still further aspect relates to methods of manufacturing an article comprising a microelectronic device, said method comprising contacting the microelectronic device with a cleaning composition for sufficient time to clean post-CMP residue and contaminants from the microelectronic device having said residue and contaminants thereon, and incorporating said microelectronic device into said article, using a cleaning composition described herein.

In another aspect, a method of removing post-CMP residue and contaminants from a microelectronic device having same thereon is described, said method comprising:
  polishing the microelectronic device with a CMP slurry;
  contacting the microelectronic device with a cleaning composition described herein for a sufficient time to remove post-CMP residue and contaminants from the microelectronic device to form a post-CMP residue-containing composition; and
  continuously contacting the microelectronic device with the post-CMP residue-containing composition for a sufficient amount of time to effect substantial cleaning of the microelectronic device, Another aspect relates to an article of manufacture comprising a cleaning composition, a microelectronic device, and material selected from the group consisting of residue, contaminants and combinations thereof, wherein the cleaning composition comprises at least one quaternary base, at least one amine, at least one complexing agent, optionally at least one reducing agent, optionally at least one additional etchant, optionally at least one cleaning additive, and water, and wherein the cleaning composition is substantially devoid of alkali hydroxides, alkaline earth metal hydroxides, and tetramethylammonium hydroxide, and the residue comprises at least one of post-CMP residue, post-etch residue and post-ash residue.

Another aspect relates to an article of manufacture comprising a cleaning composition, a microelectronic device, and material selected from the group consisting of residue, contaminants and combinations thereof, wherein the cleaning composition comprises at least one amine, cysteine, at least one quaternary base, optionally at least one additional chelating agent, optionally at least one reducing agent, optionally at least one additional etchant, optionally at least one cleaning additive, and water, wherein the composition is substantially devoid of alkali hydroxides, alkaline earth metal hydroxides, and tetramethylammonium hydroxide, and the residue comprises at least one of post-CMP residue, post-etch residue and post-ash residue.

EXAMPLE 1

Three solutions A-D were prepared as shown below. These concentrates were diluted in a range from about 60:1 to 250:1 with deionized water. Thereafter, the etch rate of copper and cobalt was determined by immersing a PVD coupon of Co and Cu in each solution for 30 minutes at 25° C.

| Formulation | choline-OH/wt % | MEA/wt % | ascorbic acid/wt % | dimethyl glyoxime/wt % | cysteine/wt % | water |
|---|---|---|---|---|---|---|
| A | 5-10 wt % | 2-8 wt % | 2-8 wt % | 0.0005-0.1 wt % | — | balance |
| B | 5-10 wt % | 2-8 wt % | 2-8 wt % | — | 0.0005-0.2 wt % | balance |
| C | — | 2-8 wt % | 2-8 wt % | — | 0.0005-0.2 wt % | balance |
| D | 5-10 wt % | 2-8 wt % | | | 0.0005-0.2 wt % | balance |
| E | 0-2 wt % | 2-8 wt % | | | 0.0005-0.2 wt % | balance |

It was determined that formulation D had the lowest Co etch rate. Without being bound by theory, it is thought that the lower etch rate is possibly the result of the pH (in a range from about 10 to about 14) and/or the presence of cysteine, permitting the formation of a CoO and/or Co hydroxide layer, thus passivating the Co metal. In the case of formulation E, the Co etch rate was higher than formulation D, but the copper was substantially protected.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. A composition comprising at least one organic amine, at least one solvent, at least one quaternary base, at least one complexing agent, at least one reducing agent, optionally at least one additional etchant, and optionally at least one cleaning additive, wherein the cleaning composition is substantially devoid of alkali hydroxides, alkaline earth metal hydroxides, and tetramethylammonium hydroxide.

2. The composition of claim 1, wherein the at least one organic amine comprises a species having the general formula $NR^1R^2R^3$, wherein $R^1$, $R^2$ and $R^3$ may be the same as or different from one another and are selected from the group consisting of hydrogen, straight-chained or branched $C_1$-$C_6$ alkyl, straight-chained or branched $C_1$-$C_6$ alcohol, and straight chained or branched ethers having the formula $R^4$—O—$R^5$, where $R^4$ and $R^5$ may be the same as or different from one another and are selected from the group consisting of $C_1$-$C_6$ alkyls.

3. The composition of claim 1, wherein the at least one organic amine comprises a species selected from the group consisting of aminoethylethanolamine, N-methylaminoethanol, aminoethoxyethanol, dimethylaminoethoxyethanol, diethanolamine, N-methyldiethanolamine, monoethanolamine, triethanolamine, 1-amino-2-propanol, 3-amino-1-propanol, diisopropylamine, isopropylamine, 2amino-1-butanol, isobutanolamine, other $C_1$-$C_8$ alkanolamines, triethylenediamine, ethylenediamine, hexamethylenediamine, diethylenetriamine, triethylamine, trimethylamine, 1-methoxy-2aminoethane, diglycolamine, morpholine, and combinations thereof.

4. The composition of claim 1, wherein the at least one quaternary base has the formula $NR^1R^2R^3R^4OH$ or $PR^1R^2R^3R^4OH$, wherein $R^1$, $R^2$, $R^3$ and $R^4$ may be the same as or different from one another and are selected from the group consisting of hydrogen, straight-chained or branched $C_2$-$C_6$ alkyl, and substituted or unsubstituted $C_6$-$C_{10}$ aryl.

5. The composition of claim 1, wherein the at least one quaternary base comprises a species selected from the group consisting of tetraethylammonium hydroxide (TEAH), tetrapropylammonium hydroxide (TPAH), tetrabutylammonium hydroxide (TBAH), tributylmethylammonium hydroxide (TBMAH), benzyltrimethylammonium hydroxide (BTMAH), ethyltrimethylammonium hydroxide, choline hydroxide, tris(2-hydroxyethyl)methyl ammonium hydroxide, diethyldimethylammonium hydroxide, tetrabutylphosphonium hydroxide (TBPH), tetramethylphosphonium hydroxide, tetraethylphosphonium hydroxide, tetrapropylphosphonium hydroxide, benzyltriphenylphosphonium hydroxide, methyl triphenylphosphonium hydroxide, ethyl triphenylphosphonium hydroxide, N-propyl triphenylphosphonium hydroxide, and combinations thereof.

6. The composition of claim 1, wherein the at least one complexing agent comprises a species selected from the group consisting of acetic acid, acetone oxime, acrylic acid, adipic acid, alanine, arginine, asparagine, aspartic acid, betaine, dimethyl glyoxime, formic acid, fumaric acid, gluconic acid, glutamic acid, glutamine, glutaric acid, glyceric acid, glycerol, glycolic acid, glyoxylic acid, histidine, iminodiacetic acid, isophthalic acid, itaconic acid, lactic acid, leucine, lysine, maleic acid, maleic anhydride, malic acid, malonic acid, mandelic acid, 2,4-pentanedione, phenylacetic acid, phenylalanine, phthalic acid, proline, propionic acid, pyrocatecol, pyromellitic acid, quinic acid, serine, sorbitol, succinic acid, tartaric acid, terephthalic acid, trimellitic acid, trimesic acid, tyrosine, valine, xylitol, ethylenediamine, oxalic acid, tannic acid, benzoic acid, ammonium benzoate, catechol, pyrogallol, resorcinol, hydroquinone, cyanuric acid, barbituric acid, 1,2dimethylbarbituric acid, pyruvic acid, propanethiol, benzohydroxamic acids, tetraethylenepentamine (TEPA), 4-(2-hydroxyethyl)morpholine (HEM), N-aminoethylpiperazine (N-AEP), ethylenediaminetetraacetic acid (EDTA), 1,2-cyclohexanediamine-N,N,N',N'-tetraacetic acid, (CDTA), glycine/ascorbic acid, iminodiacetic acid (IDA), 2-(hydroxyethyl)iminodiacetic acid (HIDA), nitrilotriacetic acid, thiourea, 1,1,3,3-tetramethylurea, urea, urea derivatives, glycine, alanine, arginine, asparagine, aspartic acid, cysteine, glutaric acid, glutamic acid, glutamine, histidine, isoleucine, leucine, lysine, methionine, phenylalanine, piperadine, N-(2-aminoethyl) piperadine, proline, pyrrolidine, serine, threonine, tryptophan, tyrosine, valine, phosphonic acid, 1hydroxyethylidene-1,1-diphosphonic acid (HEDP), 1,5,9-triazacyclododecane-N,N',N"tris(methylenephosphonic acid) (DOTRP), 1,4,7,10-tetraazacyclododecane-N,N',N",N'"tetrakis(methylenephosphonic acid) (DOTP), nitrilotris(methylene)triphosphonic acid, diethylenetriaminepenta(methylenephosphonic acid) (DETAP), aminotri(methylenephosphonic acid), is(hexamethylene)triamine phosphonic acid, 1,4,7-triazacyclononane-N,N',N"tris(methylenephosphonic acid (NOTP), salts and derivatives thereof, and combinations thereof.

7. The composition of claim 6, wherein the at least one complexing agent comprises cysteine, oxalic acid, or a combination of cysteine and oxalic acid.

8. The composition of claim 1, wherein the at least one reducing agent comprises a species selected from the group consisting of ascorbic acid, L(+)-ascorbic acid, isoascorbic acid, ascorbic acid derivatives, formamidinesulfinic acid, cysteine, and any combination thereof.

9. The composition of claim 1, comprising the at least one additional etchant, wherein the at least one additional etchant is selected from the group consisting of morpholine, diglycolamine, 3-butoxypropylamine, propylene glycol monobutyl ether, hydroxyethylmorpholine, hydroxypropylmorpholine, aminoethylmorpholine, aminopropylmorpholine, pentamethyldiethylenetriamine (PMDETA), trimethylaminoethylethanolamine, trimethylaminopropylethanolamine, and combinations thereof.

10. The composition of claim 1, comprising the at least one cleaning additive, wherein the at least one cleaning additive is selected from the group consisting of hydroxypropylcellulose, hydroxyethylcellulose, carboxymethylcellulose sodium carboxymethylcellulose (Na CMC), polyvinylpyrrolidone (PVP), any polymer made using the Nvinyl pyrrolidone monomer, polyacrylic acid esters and analogoues of polyacrylic acid esters, polyalanine, polyleucine, polyglycine, polyamidohydroxyurethanes, polylactones, polyacrylamide, Xanthan gum, chitosan, polyethylene oxide, polyvinyl alcohol, polyvinyl acetate, polyacrylic acid, polyethyleneimine, sorbitol, xylitol, esters of anhydrosorbitols, secondary alcohol ethoxylates, and combinations thereof.

11. The composition of claim 1, further comprising at least one metal corrosion inhibitor selected from the group consisting of adenosine, adenine, pyrazole, 1,2,4-triazole, 1,2,3triazole, imidazole, 1H-pyrazole-4-carboxylic acid, 3-amino-5-tert-butyl-1H-pyrazole, 5-amino-1Htetrazole, 4-methylpyrazole, 2-mercaptobenzimidazole, 2-amino-5-(ethylthio)-1,3,4-thiadiazole, 2amino-5-ethyl-1,3,4-thiadiazole, derivatives thereof, and combinations thereof.

12. The composition of claim 1, comprising cysteine in a range from about 0.00005 wt % to about 0.2 wt %, based on the total weight of the composition.

13. The cleaning composition of claim 1, wherein the at least one solvent comprises water.

14. The cleaning composition of claim 1, wherein the composition is substantially devoid of at least one of oxidizing agents (e.g., hydrogen peroxide); fluoride-containing sources; abrasive materials; alkali and/or alkaline earth metal bases; tetramethylammonium hydroxide; derivatives of cysteine; surfactants; sulfonium compounds; amidoxime compounds; and combinations thereof.

15. A method of removing residue and contaminants from a microelectronic device having said residue and contaminants thereon, said method comprising contacting the microelectronic device with a cleaning composition comprising: at least one organic amine, at least one solvent, at least one quaternary base, at least one complexing agent, at least one reducing agent, optionally at least one additional etchant, and optionally at least one cleaning additive, wherein the cleaning composition is substantially devoid of alkali hydroxides, alkaline earth metal hydroxides, and tetramethylammonium hydroxide.

16. The method of claim 15, comprising cysteine in a range from about 0.05 to about 0.2 wt %, based on the total weight of the composition.

17. The method of claim 15, wherein the at least one complexing agent comprises a species selected from the group consisting of acetic acid, acetone oxime, acrylic acid, adipic acid, alanine, arginine, asparagine, aspartic acid, betaine, dimethyl glyoxime, formic acid, fumaric acid, gluconic acid, glutamic acid, glutamine, glutaric acid, glyceric acid, glycerol, glycolic acid, glyoxylic acid, histidine, iminodiacetic acid, isophthalic acid, itaconic acid, lactic acid, leucine, lysine, maleic acid, maleic anhydride, malic acid, malonic acid, mandelic acid, 2,4-pentanedione, phenylacetic acid, phenylalanine, phthalic acid, proline, propionic acid, pyrocatecol, pyromellitic acid, quinic acid, serine, sorbitol, succinic acid, tartaric acid, terephthalic acid, trimellitic acid, trimesic acid, tyrosine, valine, xylitol, ethylenediamine, oxalic acid, tannic acid, benzoic acid, ammonium benzoate, catechol, pyrogallol, resorcinol, hydroquinone, cyanuric acid, barbituric acid, 1,2dimethylbarbituric acid, pyruvic acid, propanethiol, benzohydroxamic acids, tetraethylenepentamine (TEPA), 4-(2-hydroxyethyl)morpholine (HEM), N-aminoethylpiperazine (N-AEP), ethylenediaminetetraacetic acid (EDTA), 1,2-cyclohexanediamine-N,N,N',N'-tetraacetic acid, (CDTA), glycine/ascorbic acid, iminodiacetic acid (IDA), 2-(hydroxyethyl)iminodiacetic acid (HIDA), nitrilotriacetic acid, thiourea, 1,1,3,3-tetramethylurea, urea, urea derivatives, glycine, alanine, arginine, asparagine, aspartic acid, cysteine, glutaric acid, glutamic acid, glutamine, histidine, isoleucine, leucine, lysine, methionine, phenylalanine, piperadine, N-(2-aminoethyl) piperadine, proline, pyrrolidine, serine, threonine, tryptophan, tyrosine, valine, phosphonic acid, 1hydroxyethylidene-1,1-diphosphonic acid (HEDP), 1,5,9-triazacyclododecane-N,N',N"tris(methylenephosphonic acid) (DOTRP), 1,4,7,10-tetraazacyclododecane-N,N',N",N'"tetrakis(methylenephosphonic acid) (DOTP), nitrilotris(methylene)triphosphonic acid, diethylenetriaminepenta(methylenephosphonic acid) (DETAP), aminotri(methylenephosphonic acid), is(hexamethylene)triamine phosphonic acid, 1,4,7-triazacyclononane-N,N',N"tris(methylenephosphonic acid (NOTP), salts and derivatives thereof, and combinations thereof, preferably cysteine, dimethyl glyoxime, tartaric acid, oxalic acid, or any combination thereof.

18. The method of claim 17, wherein the at least one complexing agent comprises cysteine, oxalic acid, or a combination of cysteine and oxalic acid.

19. The composition of claim 1, wherein the at least one quaternary base comprises choline hydroxide.

20. The composition of claim 1, wherein the at least one reducing agent comprises ascorbic acid.

* * * * *